United States Patent [19]

Geary

[11] 4,360,894
[45] Nov. 23, 1982

[54] MULTI-TRACK FERROELECTRIC DEVICE

[75] Inventor: John M. Geary, Summit, N.J.

[73] Assignee: Bell Telephone Laboratories, Incorporated, Murray Hill, N.J.

[21] Appl. No.: 208,835

[22] Filed: Nov. 20, 1980

[51] Int. Cl.³ .................................... G11C 11/22
[52] U.S. Cl. ................................ 365/117; 365/45
[58] Field of Search ............... 365/117, 45, 48, 183, 365/73, 76, 77

[56] References Cited

U.S. PATENT DOCUMENTS 3,564,515  2/1971  Gratian ........................... 365/76
4,290,118  9/1981  Stern et al. ..................... 365/183

Primary Examiner—Terrell W. Fears
Attorney, Agent, or Firm—Peter A. Businger

[57] ABSTRACT

Domain wall motion in a slab of ferroelectric material gives rise to an electrical signal which may correspond, e.g., to electrode width fluctuations or to a radiation pattern incident on a sensitive layer. A device may have numerous ferroelectric readout tracks, in which case the number of electrical leads can be minimized by a layout in which unidirectional movement of a planar ferroelectric domain wall not only serves to scan a track but also select a track from a large number of tracks. Such device operation is a feature of a device in which a ferroelectric slab is cut, e.g., in the manner of a comb or ladder. Resulting devices may be operated by judicious cycling of voltages at as few as two control electrodes, one defining an access track, and the other being common to the readout tracks.

9 Claims, 14 Drawing Figures

MULTI-TRACK FERROELECTRIC DEVICE

TECHNICAL FIELD

The invention is concerned with ferroelectric devices and, more particularly, with devices comprising a plurality of ferroelectric domain wall motion tracks.

BACKGROUND OF THE INVENTION

Ferroelectric materials exhibit electric polarization in particular directions and permit the simultaneous, side-by-side presence of regions having differing polarization. Examples are gadolinium molybdate and lead germanate, both having just two directions of polarization which are opposites of each other.

Devices have been proposed whose operation is based on scanning motion of a ferroelectric domain wall in a supported or unsupported layer or film of a ferroelectric material, as described, e.g., in J. M. Geary, "Experimental Ferroelectric Domain Wall Motion Devices", *Applied Physics Letters*, Vol. 32 (1978), pp. 455-457 and in J. M. Geary, "Monolithic Electronic Devices Based on Domain Wall Motion in a Ferroelectric Crystal", *Bell System Technical Journal*, Vol. 58 (1979), pp. 467-489.

Among ferroelectric devices are, in particular, an analog readout device as disclosed in R. A. Lemons et al., "Analog Read-Only Memory Using Gadolinium Molybdate", *Applied Physics Letters*, Vol. 33 (1978), pp. 373-375. Operation of this device involves scanning motion of a ferroelectric domain wall past a patterned electrode on a ferroelectric film, the pattern being chosen so as to correspond to a desired electrical waveform as may be suitable to drive, e.g., a loudspeaker or an optical display device. Accordingly, each time a domain wall is made to move past such patterned electrode, the desired electrical signal is reproduced.

Readout of one of a plurality of waveforms may be from a device having side-by-side readout tracks. However, disclosed devices require two electrical leads per track which may be prohibitive if the number of tracks is large. Moreover, if a planar-wall type material such as, e.g., gadolinium molybdate is used, readout of a selected track may be subject to interference from non-selected tracks.

Similarly based on ferroelectric domain wall motion in a ferroelectric film is a device, disclosed in above-identified papers by J. M. Geary, for producing an electrical signal in response to a physical influence on a surface; typically, the influence may be a radiation pattern incident on a sensitive layer which adheres to a ferroelectric film. Such assembly of a ferroelectric film and adhering sensitive layer is between electrodes such that, upon application of a suitable voltage, a ferroelectric domain wall moves in the film. As a result of domain wall motion, an electrical current signal can be sensed in a lead to an electrode, such signal being time-varying in correspondence to the spatial variation of radiation incident on the device.

If scanning of a two-dimensional pattern is desired, scanning may be, e.g., in raster fashion by a plurality of adjacent devices. Alternatively, as disclosed in an above-identified paper by J. M. Geary, a device may incorporate a shift register for positioning a ferroelectric domain in a y-direction adjacent to a track to be scanned in an x-direction. Implementation of such x-y design is based on a ferroelectric material in which ferroelectric domains may have arbitrary shape as, e.g., in lead germanate. On the other hand, in the case of devices based on planar-wall type ferroelectric material, it appears necessary to utilize a multitude of adjacent one-dimensional devices to form a two-dimensional device. This, however, may again result in a potentially prohibitive number of electrical connections to a device.

SUMMARY OF THE INVENTION

To minimize the number of electrical connections to a two-dimensional ferroelectric device comprising a planar-wall type ferroelectric material, a device in accordance with the invention has ferroelectric domain wall tracks such that gaps between tracks have boundaries such that a unidirectionally moving ferroelectric domain wall reaches such boundaries in sequence rather than simultaneously. As few as two control electrodes suffice to gain access to and scan any one of a plurality of ferroelectric domain wall motion tracks.

Devices of the invention comprise a supported or unsupported slab, layer, or film of a ferroelectric material, they comprise electrode layers, and they optionally comprise additional layers such as, e.g., a radiation sensitive layer interposed between an electrode layer and either side of the ferroelectric layer. Ferroelectric domain wall motion tracks are defined by cuts in a ferroelectric layer or film as may be made, e.g., by photolithographic processing and etching; tracks may have constant or varying width.

Typical device operation consists in transporting a ferroelectric domain wall in, e.g., a y-direction to a position at the entrance of a track, followed by scanning of the positioned wall in an x-direction. Movement in a y-direction may be in response to a voltage applied to an access track electrode, and movement in the x-direction may be in response to a voltage applied to a single readout track electrode which is common to a plurality of readout tracks.

DETAILED DESCRIPTION

Figure 1:
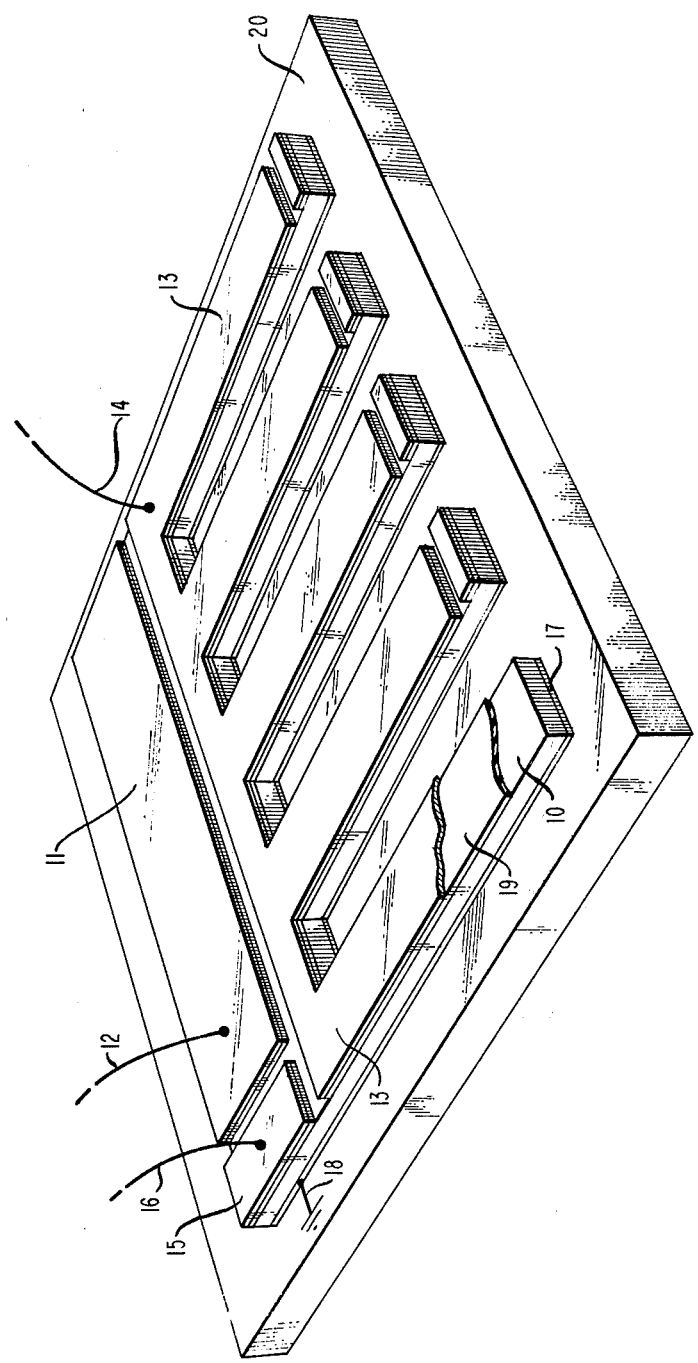
FIG. 1 shows, schematically and in perspective, a device in accordance with the invention.

Devices of the invention include a ferroelectric material which permits the simultaneous presence of regions or domains of differing polarization, domains of differing polarization being separated by a domain wall which is typically parallel to preferred polarization directions and generally perpendicular to the faces of the film. A domain expands in the presence of an electric field having a component which is parallel to the polarization of a domain; conversely, a domain contracts in the presence of a field having a component which is antiparallel to the polarization of the domain.

As a domain expands or contracts in response to a voltage applied to electrodes, a current flows in leads to the electrodes. If electrodes are in intimate contact with facing sides of a ferroelectric film, and if a ferroelectric domain wall passes between the electrodes, then current is proportional to the rate at which electrode area is swept out by an advancing domain wall. Such current may be sensed as output signal and can be fed to other devices as input signal.

If an advancing domain wall is essentially straight and perpendicular to the direction of advance, the swept out area increment is represented by the product of local electrode width and increment of forward motion. Consequently, if wall velocity is constant, current is proportional to local electrode width. Current originates from points of the ferroelectric material where a moving domain wall passes, i.e., a scanning domain wall acts as a moving current source. Accordingly, current may depend on a locally varying influence or disturbance on the ferroelectric film. Furthermore, if a ferroelectric film material is also ferroelastic, domain wall mobility in the ferroelectric film may also be influenced by localized changes of mechanical compliance or viscosity in a responsive layer.

Devices in accordance with the invention include a ferroelectric material in the form of a supported or unsupported layer, film, platelet, membrane, or slab; in this disclosure the term "slab" is preferentially used merely for the sake of convenience. A preferred material is such that it permits the nucleation of ferroelectric domains and the propagation of domain walls. Nucleation is typically at a corner of a slab and in an electric field having a sufficiently large field strength component in a direction perpendicular to the plane of the slab. Once a domain is nucleated, domain wall propagation is preferably in the absence of nucleation of additional ferroelectric domains, i.e., at field strengths which are insufficient for nucleation. Electric fields are conveniently produced by means of patterned electrodes which are atop all or part of a face of a slab and which preferably extend to an edge of a slab. A nucleator electrode preferably extends to two such edges which define a corner of the slab. Preferred materials further are of a kind in which ferroelectric domain walls are essentially straight, extending across the bulk to the edges of a slab; such ferroelectric materials may conveniently be designated as being of planar-wall type. An example is gadolinium molybdate which, as may be typical, is a ferroelectric material which is also ferroelastic. For support of ferroelastic materials, a compliant support material is desirable.

Devices of the invention have a plurality of at least three ferroelectric domain wall motion tracks which here are conveniently designated as readout tracks; in a commercial application the number of such tracks more typically may be several hundred. Tracks are separated by physical gaps which extend through the entire thickness of a slab, yet permit domain wall access from an additional track which here is conveniently designated as access track. Such configuration may have the general appearance, e.g., of a comb (with readout tracks projecting from an access track) or a ladder (with readout tracks supported at both ends), track length typically being orders of magnitude greater than track width and track spacing. Length-to-width ratio is typically at least 100. While tracks may typically be straight and parallel, curved and nonparallel configurations are not precluded. It is a feature of the invention that gaps between tracks have boundaries such that a unidirectionally moving ferroelectric domain wall reaches such boundaries in sequence rather than simultaneously.

General device configuration may be as depicted in FIG. 1 which shows ferroelectric slab 10, ground electrode 17 with lead 18, sensitive layer 19, readout track electrode 13 with lead 14, access electrode 11 with lead 12, nucleator electrode 15 with lead 16, and support 20. Slab 10 is cut from a crystal of ferroelectric material so as to have a ferroelectric domain wall direction which is at an angle to the ferroelectric readout tracks. Operation of the device is initiated by applying a suitable voltage to lead 16, resulting in nucleation of a ferroelectric domain at the underlying corner of slab 10. Optional breaks in the electrode layer at the end of readout tracks serve as ferroelectric domain wall stops.

One mode of operation of the device shown in FIG. 1 is illustrated by FIG. 4, A–D. Such operation is based on ferroelectric domain wall motion which is in a positive y-direction when a positive voltage is applied to electrode 11, in a negative y-direction when a negative voltage is applied to electrode 11, in a positive x-direction when a positive voltage is applied to electrode 13, and in a negative x-direction when a negative voltage is applied to electrode 13. A domain wall stops if a sufficient portion of its length is under an electrode to which no voltage is applied; a wall also stops under an open-circuited electrode. FIG. 4A shows a ferroelectric domain expanded, by application of a positive voltage to electrode 11 and in the absence of a voltage at electrode 13, so that a domain wall has propagated in the access track to a position just short of a selected readout track. In the course of propagation the advancing wall stretches across the crystal from edge to edge, terminating on one side at the left-hand boundary of the access track and on the right-hand side at the boundary of a gap separating two readout tracks. As a domain wall advances further, it will become tangent to the boundary of the next gap between readout tracks. Any additional advance of the wall will cause it to become separated into two segments at the point of tangency. The segment which primarily underlies electrode 11 will continue motion in the y-direction while the segment which primarily underlies electrode 13 becomes stationary in the absence of a voltage at electrode 13. Accordingly, movement of the advancing domain wall leaves behind a succession of domain wall segments at the entrance of readout tracks.

Positioning of a domain wall in the y-direction may be monitored in various ways. Although the total length of the advancing wall varies as described above, the driven portion of the wall underlying electrode 11 stays constant in length. It is the positive voltage of electrode 11 which propels the entire length of the wall, and the portion of the wall underlying electrode 13 (at zero voltage) is not actively propelled. In fact, such portion acts to slow the rate of advance of the entire wall. Accordingly, the rate of advance of the wall will fluctuate periodically, exhibiting one cycle of fluctuation as it passes each readout track. These fluctuations in velocity give rise to corresponding current fluctuations in lead 12 and, by counting such current fluctuations, the position of an advancing wall can be continuously monitored. Accordingly, by counting current fluctuations in lead 12 a wall can be positioned as desired. Alternatively, if wall velocity is held constant by a feedback arrangement, voltage fluctuations at electrode 11 can be similarly monitored.

Observation of pulses may be facilitated by accentuating variations in wall length, e.g., by suitable patterning of the device edge at which electrode 11 terminates. Alternatively, control may be by a plurality of electrodes operating as a shift register in lieu of contiguous electrode 11.

Figure 4A:
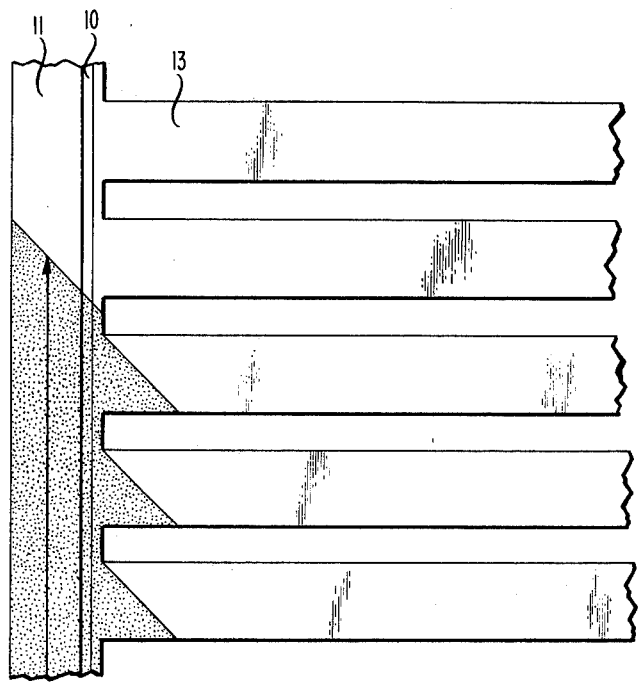
FIG. 4, A through D, illustrates a mode of operation of a device in accordance with the invention.
Figure 4B:
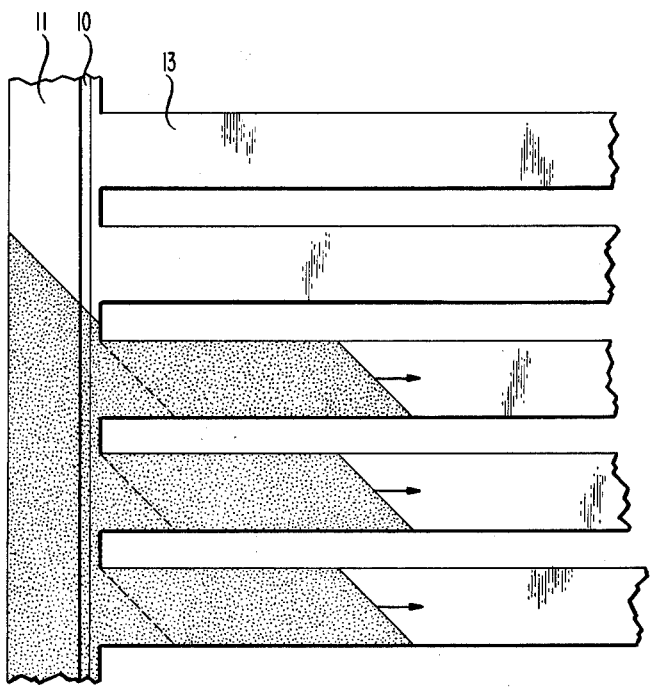
Figure 4C:
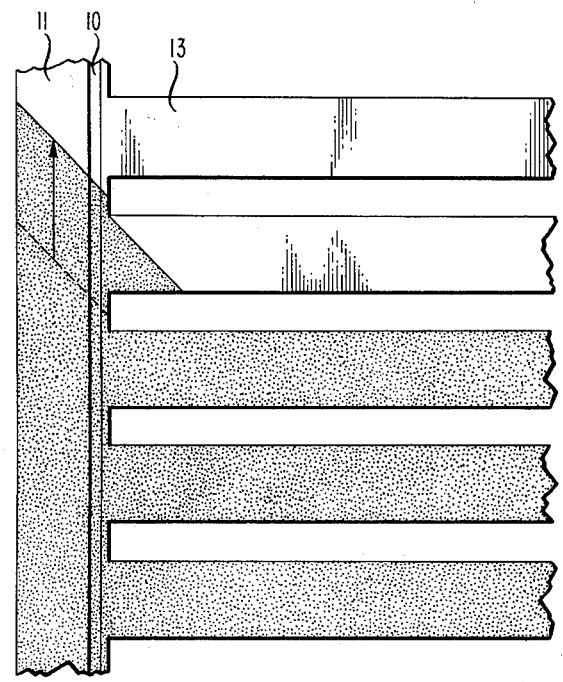
Figure 4D:
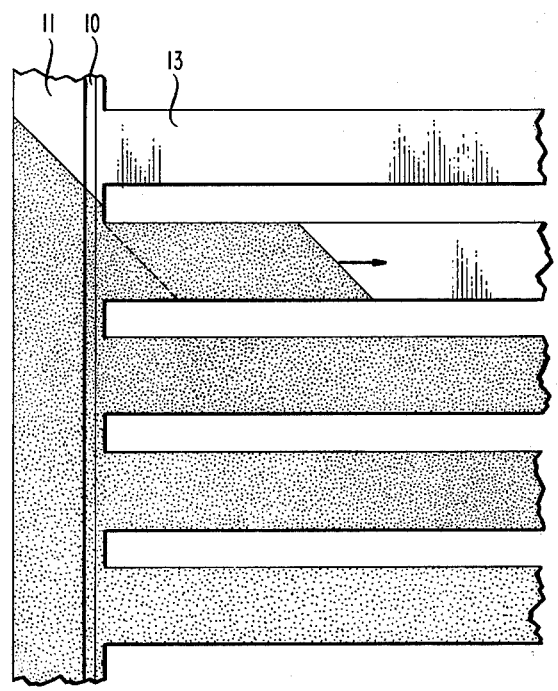

FIG. 4B shows three domain walls being moved to the end of readout tracks by application of a positive voltage to electrode 13 while no voltage is applied to electrode 11. This is not for the purpose of obtaining an output signal from these tracks, and any signal generated during this step in lead 14 is ignored. FIG. 4C shows the domain wall in the access track advanced just past the selected readout track by means of a positive voltage applied to electrode 11 while no voltage is applied to electrode 13. This leaves a new domain wall segment at the beginning of the selected track. Tracks above the selected track have no domain walls and tracks below the selected track have already been scanned by their domain walls. Therefore, the selected track is the only track scanned when a positive voltage is applied to electrode 13 while no voltage is applied to electrode 11. This step is illustrated by FIG. 4D.

In summary, by judicious cycling of voltages at just two electrodes, one of which is common to all readout tracks, described device operation thus allows access to and scanning of any one of a plurality of readout tracks. This has been made possible by the inclination of the domain walls with respect to the direction of the access track. A wall having such inclination is capable of propagating in one direction while leaving segments of itself which are capable of moving in another direction.

It is evident that the described mode of operation is readily adaptable to raster scanning by relatively slow, continuous advancing of a domain wall in a y-direction while electrode 13 is kept at a positive voltage. As domain wall segments are left behind, the readout tracks will be scanned in sequence.

If, as is the case in the device of FIG. 1, domain walls are prevented from reaching the physical end of readout tracks, a device may be recycled prior to renewed access by applying negative voltages to electrodes 11 and 13 causing domain walls to move first in a negative x-direction to the beginning of readout tracks, followed by movement of a domain wall in the access track in a negative y-direction. Alternatively, devices may be designed by omitting domain wall stops at the end of tracks, in which case domain walls are lost at the end of readout tracks. In this case, a device may be re-accessed immediately by voltages opposite those used in a previous cycle.

An alternate mode of operation is illustrated by FIG. 5, A-D. FIG. 5A is analogous to FIG. 4A except that a domain wall has been advanced in the access track just past a selected readout track. This set has left walls at the entrances of four nonselected readout tracks which, in FIG. 5B, are shown advanced a short distance into the readout tracks, this by application of a positive voltage to electrode 13 while electrode 11 is essentially at zero voltage.

Figure 5A:
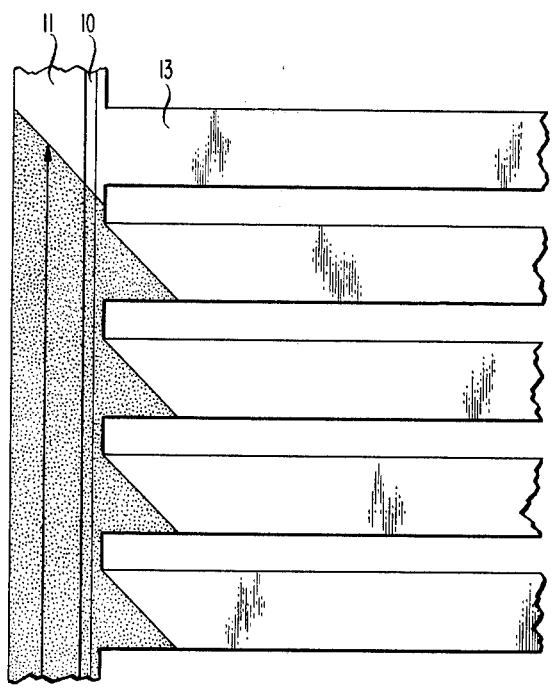
FIG. 5, A through E, illustrates an alternate mode of operation of a device in accordance with the invention.
Figure 5B:
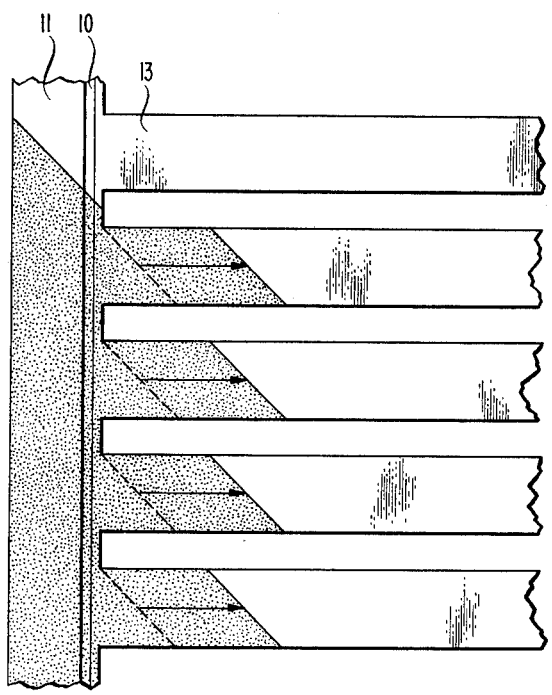
Figure 5C:
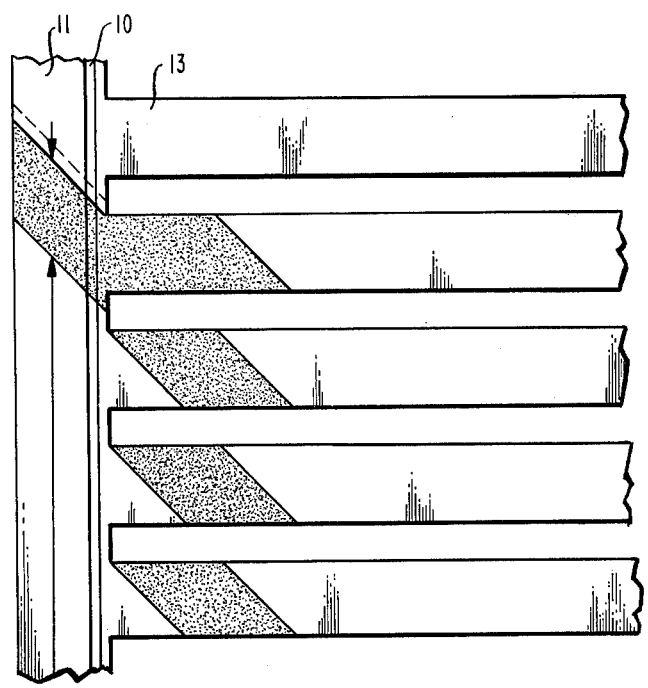

FIG. 5C shows an additional ferroelectric domain wall moved to a position just short of the selected readout track; such wall is the result of additional nucleation and propagation by a negative voltage applied to electrode 11, while no voltage is applied to electrode 13. Also, as a result of applying such negative voltage to electrode 11, the original domain wall in the access track attempts to move back, in a negative y-direction. However, this motion is prevented when the wall becomes tangent to the boundary of the gap between readout tracks. The wall is "pinned" at such point. Further movement in a negative y-direction would require an inordinate voltage applied to electrode 11 because such movement would necessitate the energetically unfavorable, sudden creation of a new segment of domain wall across a readout track. (The step shown in FIG. 5B, where walls were moved a short distance into the readout tracks, was taken to produce just this pinning effect.)

Figure 5D:
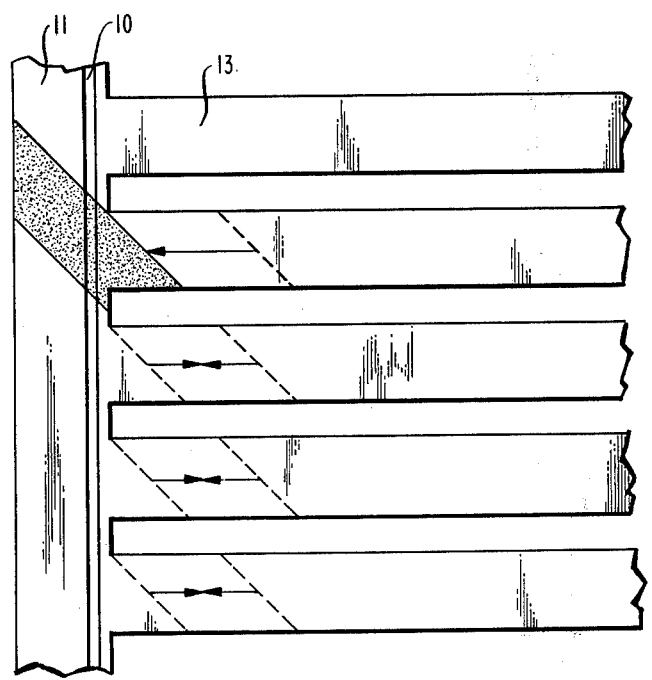

FIG. 5D shows walls in readout tracks having moved in a negative x-direction upon application of a negative voltage to electrode 13 and in the absence of a voltage at electrode 11. This results in disappearance of domains in nonselected tracks. Finally, in FIG. 5E, the selected readout track is shown being scanned by a wall upon application of a positive voltage to electrode 13 with zero voltage applied to electrode 11.

Figure 5E:
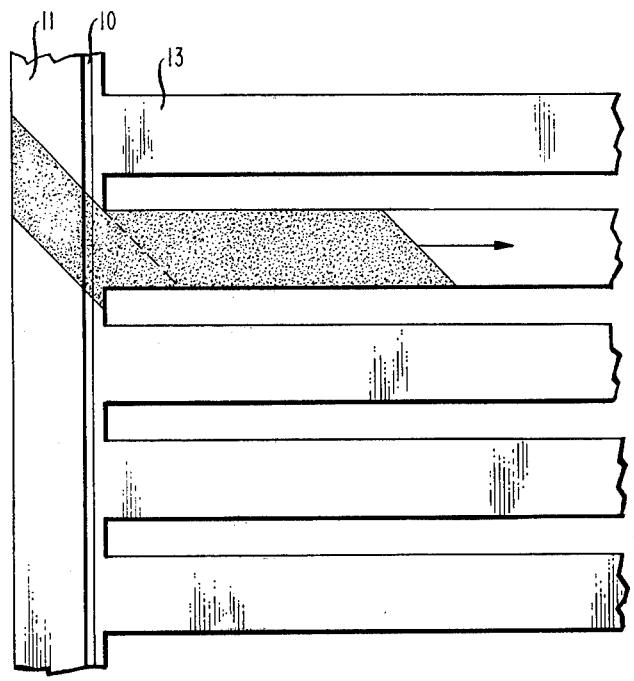

Recycling before reaccessing the device is even faster in this mode of operation as compared with the mode illustrated in FIG. 4. If negative voltages are applied to electrodes 11 and 13, a domain as shown in FIG. 5E contracts by wall motion from both ends of the track and vanishes when the walls meet in mid-track.

Figure 2:
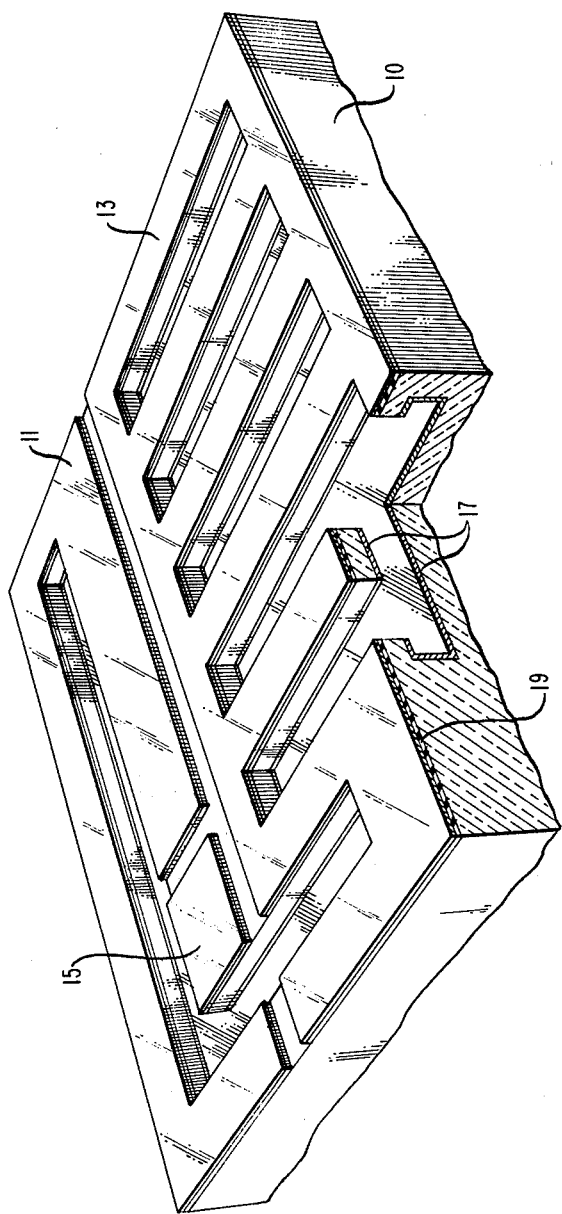
FIG. 2 shows, schematically and in perspective, an alternate embodiment of a device in accordance with the invention.

An alternate embodiment of the configuration of FIG. 1 is shown in FIG. 2. Reference numbers are as described for FIG. 1; a main difference lies in the undercutting of a surface layer of a bulk ferroelectric crystal. An L-shaped cut near the left corner in FIG. 2 borders the device such that no pinning of nucleated domain walls occurs at reentrant corners.

Devices in accordance with FIG. 2 may be more easily handled due to bulk crystal support at the ends of readout tracks even if readout tracks are long and narrow. Small ferroelastic strain produced in the course of device operation should be easily accommodated by natural flexing of the long, thin tracks. Since inordinate energy would be required to move a ferroelectric domain wall past the end of a readout track into the bulk crystal due to a pinning effect similar to that described above, domain wall stops are dispensable. Accordingly, a recycle step as described above is required before reaccessing a device.

Manufacture of devices in accordance with FIG. 2 may be by known photolithographic etching techniques, e.g., by first etching deep trenches, applying a protective coating part way down the walls of the trenches, and then etching again for undercutting.

Figure 3:
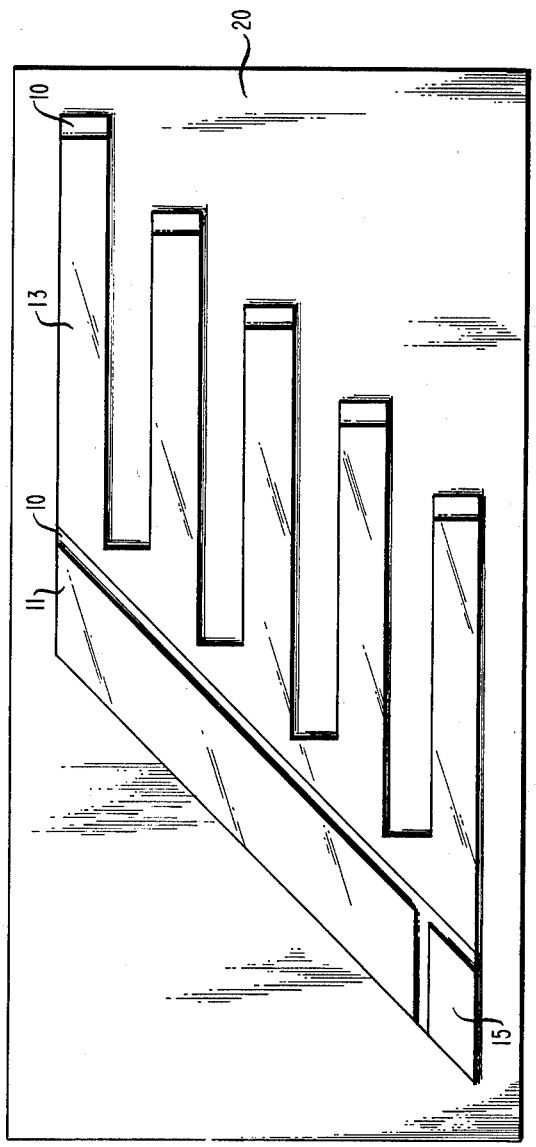
FIG. 3 shows, schematically and in plan view, a third embodiment of a device in accordance with the invention.

FIG. 3 shows an alternate device configuration having the appearance of a parallelogram. If, e.g., slab 10 has a ferroelectric domain wall direction which is vertical in the Figure, the device functions in the same manner as the devices of FIGS. 1 and 2. In fact, the device configuration of FIG. 3 can essentially be obtained by rotating the device of FIG. 1 through an angle of 45 degrees in a clockwise direction and then "bending back" the readout tracks to a horizontal position.

Figure 6A:
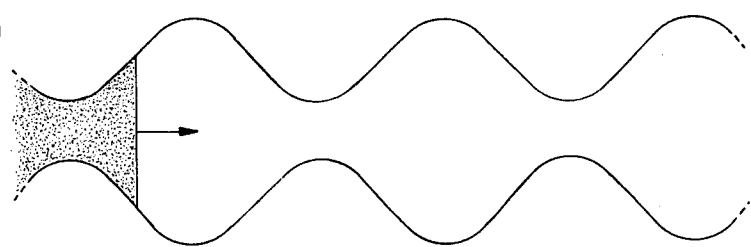
FIG. 6, A and B, illustrates ferroelectric domain wall motion tracks which vary in width in accordance with the invention.
Figure 6B:
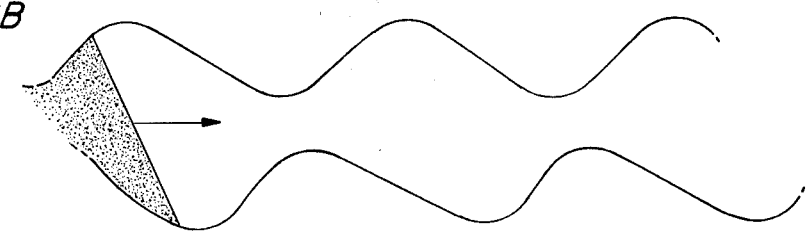

Devices of the invention may include a sensitive layer as shown in the Figures and may produce an electrical signal which varies according to the intensity to an influence such as, e.g., a radiation pattern incident on a device. Devices may also be designed as analog read-only memories, e.g., by etching gaps between readout tracks so that track width varies from place to place along the length of the track according to a desired waveform. FIG. 6A shows a domain wall advancing in a track having sinusoidally varying width; if the domain wall is at an angle, a corresponding track may be as in FIG. 6B. In either case, a signal is obtained corresponding to variations of the length of a moving domain wall.

Among additional variations of configuration and operation is the possibility of domain wall propagation from either side of an access track, e.g., by accessing in a positive or negative y-direction to minimize access time. Also, a device similar to the device of FIG. 2 may be designed for access to both sides of readout tracks by employing a ladder shaped configuration. And, several devices may be implemented on a single slab of ferroelectric material, each device including a block of readout tracks and an associated access track. Finally, breaks may be introduced into electrod 13, thus breaking up electrode 13 into segments, each defining a block of tracks, and each having its own external electrical connection.

Manufacture of devices of the invention may be by cutting of an appropriately oriented slab from a ferroelectric crystal, optional deposition of a sensitive layer, deposition of electrode layers, and selective etching of track and electrode features.

Photolithographic processing may allow spacing of readout tracks of as little as a few micrometers. Such spacing, conveniently designated as feature size, may determine the desired distance which is travelled by a ferroelectric domain wall between points of initial contact with the boundaries between readout tracks. Specifically, such distance may preferably be greater than or equal to one tenth of feature size.

EXAMPLE

The device of FIG. 1 was fabricated from a 80 micrometer thick polished platelet of gadolinium molybdate. The platelet was metallized on both sides with a semitransparent layer of Ni-Cr. The metallization on one side was mechanically patterned by scribing to define the nucleator, access track and wall stops. The platelet was then adhered to a glass carrier with room temperature curing silicone rubber (RTV). A thin layer of RTV was coated over the gadolinium molybdate to serve as an etch resistant mask. The mask was mechanically patterned to open up 0.1 mm wide paths outlining the device and defining the gaps between the horizontal tracks. The platelet (still attached to its carrier) was etched all the way through in the exposed areas by immersion in 170 degree C. concentrated phosphoric acid, yielding the desired multitrack configuration. The RTV on both faces was then removed. The four leads were attached with a mechanically compliant conductive paste and the whole assembly was permanently adhered to a glass mount with soft RTV.

What is claimed is:

1. Device comprising a ferroelectric slab (10) of a planar-wall type ferroelectric material having at least one direction of ferroelectric domain wall motion, said slab having a first side and a second side which is opposite to said first side, said device comprising a first electrode layer (17) positioned atop at least a portion of said first side of said ferroelectric slab, a second electrode layer (13) positioned atop a first portion of said second side of said ferroelectric slab, and a third electrode layer (11) positioned atop a second portion of said second side of said ferroelectric slab, at least a portion of said ferroelectric slab between said first electrode and said second electrode being divided by gaps into a plurality of ferroelectric domain wall motion tracks, said plurality comprising at least a ferroelectric domain wall motion track which is here designated as the first ferroelectric domain wall motion track, a ferroelectric domain wall motion track which is adjacent to said first ferroelectric domain wall motion track and which is here designated as the second ferroelectric domain wall motion track, and a ferroelectric domain wall motion track which is adjacent to said second ferroelectric domain wall motion track and which is here designated as the third ferroelectric domain wall motion track;

said domain wall motion tracks being disposed such that movement of a ferroelectric domain wall unidirectionally in said direction of ferroelectric domain wall motion results in said ferroelectric domain wall reaching the boundary of the gap between said first ferroelectric domain wall motion track and said second ferroelectric domain wall motion track before reaching the boundary of the gap between said second ferroelectric domain wall motion track and said third ferroelectric domain wall motion track.

2. Device of claim 1 further comprising a sensitive layer (19) which is on at least a portion of said ferroelectric slab between said first electrode layer and said ferroelectric slab or on at least a portion of said ferroelectric slab between said second electrode layer and said ferroelectric slab.

3. Device of claim 1 further comprising a nucleator electrode at a corner of said slab.

4. Device of claim 1 in which said readout tracks are essentially parallel.

5. Device of claim 1 in which said readout tracks are essentially straight.

6. Device of claim 1 in which said slab is on a support.

7. Device of claim 6 in which said slab is ferroelastic and in which said support is compliant.

8. Device of claim 1 in which said slab is a surface layer of an undercut ferroelectric crystal.

9. Device of claim 1 in which said ferroelectric readout tracks have varying width in correspondence to a desired electrical waveform.

* * * * *